United States Patent

Murdock et al.

Patent Number: 6,164,390
Date of Patent: Dec. 26, 2000

[54] METHOD OF DETERMINING CHARACTERISTICS OF A ROTARY DRAG-TYPE DRILL BIT

[75] Inventors: Andrew Murdock, Stonehouse; Clive Jarvis, Swindon, both of United Kingdom

[73] Assignee: Camco International (UK) Limited, Stonehouse, United Kingdom

[21] Appl. No.: 09/245,605

[22] Filed: Feb. 5, 1999

[30] Foreign Application Priority Data

Dec. 5, 1998 [GB] United Kingdom ............... 9826723

[51] Int. Cl.$^7$ .................................................. E21B 44/00
[52] U.S. Cl. ............................................. 175/24; 175/27
[58] Field of Search ........................... 175/24, 26, 27, 175/57, 284, 424

[56] References Cited

U.S. PATENT DOCUMENTS

| | | |
|---|---|---|
| 4,629,373 | 12/1986 | Hall . |
| 4,804,051 | 2/1989 | Ho . |
| 4,842,082 | 6/1989 | Springer .................... 175/279 |
| 5,099,929 | 3/1992 | Keith et al. . |
| 5,456,141 | 10/1995 | Ho . |
| 5,608,162 | 3/1997 | Ho . |
| 5,787,022 | 7/1998 | Tibbitts et al. . |
| 5,937,958 | 8/1999 | Mensa-Wilmot et al. . |
| 5,979,570 | 11/1999 | McLoughlin et al. ............. 175/24 |

FOREIGN PATENT DOCUMENTS

| | | |
|---|---|---|
| 2 335 681 | 9/1999 | United Kingdom . |
| 95/13152 | 5/1995 | WIPO . |

OTHER PUBLICATIONS

C.J. Perry, "Directional Drilling With PDC Bits in the Gulf of Thailand" SPE 15616, presented at the 61st Annual Technical Conference and Exhibition of the Society of Petroleum Engineers held in New Orleans, LA Oct. 5–8, 1986. (9 Pages).

Primary Examiner—Roger Schoeppel
Attorney, Agent, or Firm—Jeffery E. Daly

[57] ABSTRACT

A method of predicting the walk rate of a design of rotary drag-type drill bit of the kind where the leading face of the bit body is formed with a central depression, or cone, comprises the steps of: calculating the cone volume $V_{cone}$ of the bit; calculating that ratio $$\frac{T_{cone}}{T_{bit}}$$

of the total torque generated by the cutters on the bit which is attributable to those cutters which are mounted in said cone; calculating a Walk Factor $$F = V_{cone} \times \frac{T_{cone}}{T_{bit}};$$

and then determining the predicted walk rate W of the bit from a graph, or other database, relating previously established values of F for other drill bits to the respective walk rates W for those drill bits.

8 Claims, 2 Drawing Sheets

METHOD OF DETERMINING CHARACTERISTICS OF A ROTARY DRAG-TYPE DRILL BIT

BACKGROUND OF THE INVENTION

1. Field of the Invention

The invention relates to rotary drag-type drill bits for use in drilling holes in subsurface formations and of the kind comprising a bit body having a leading face formed with a central depression which is generally coaxial with the axis of rotation of the bit, and a plurality of cutters mounted on the leading face of the bit, both within and outside said central depression. One common form of bit has a shank for connection to a drill string, a plurality of circumferentially spaced blades on the bit body extending outwardly from the central axis of rotation of the bit, and defining said leading face of the bit, a plurality of cutters being mounted along each blade. The central depression is then defined by the shapes of the inner portions of the blades. A passage in the bit body supplies drilling fluid to nozzles in the surface of the bit, between the blades, for cleaning and cooling the cutters.

The central depression in the leading face of the bit is commonly referred to as the "cone", although it is not necessarily conical in the strict geometrical sense. For example, the internal surface at the apex of the cone may be smoothly rounded, and the outer circumference of the cone is usually also smoothly rounded in section so as to blend smoothly with the rest of the leading face of the bit. For convenience, however, the central depression in the drill bit will be referred to herein as the "cone", in accordance with the conventional terminology in the drill bit industry.

The volume enclosed between the interior surface of the cone and an imaginary flat plane extending tangentially across the mouth of the cone is referred to as the "cone volume". Conveniently, the interior surface of the cone maybe regarded as being defined by the cutting profile within the cone or, for simplicity, by a smooth imaginary surface extending tangentially across the tips of the cutters mounted within the cone.

2. Description of Related Art

As is well known in the subsurface drilling industry, it is usual for drill bits to demonstrate a tendency to deviate from a straight path while drilling, by turning, or "walking", to the side particularly when the bit is drilling in a direction which is substantially horizontal or is at a comparatively small angle to the horizontal. Generally speaking, drag-type drill bits have a tendency to walk to the left, as a result of the fixed cutters generating a left-hand reactive torque during drilling.

It is common practice to use this tendency of a drill bit to walk as a parameter in controlling the direction of drilling. However, in order that this may be done effectively it is necessary to know the average walk rate of a drill bit, expressed as angular deviation over distance. Hitherto, it has not been possible to predict the walk rate of a particular drill bit design since the manner in which the various constructional characteristics of a drag-type drill bit affect walk rate have not been fully understood or quantified. It is has therefore only been possible to determine the walk rate of a particular design of bit by obtaining data from use of the bit in the field.

It would therefore be desirable to be able to predict the walk rate from data relating to the structure of the drill bit. This would then enable the performance of the drill bit to be predicted, insofar as it affects the direction of drilling, before the bit is actually operated downhole. Also, it would enable bit designs to be created or modified in a manner to give a desired walk rate. For example, under some drilling conditions it may be desirable for the walk rate of the drill bit to be at a minimum.

The present invention is based on the discovery that, in a drill bit of the kind first referred to and formed with a central depression or cone, the walk rate of the bit can be related to certain structural characteristics of the bit, thus enabling the walk rate of the bit to be predicted from such structural characteristics. In particular it has been found that the walk rate of such a drill bit is related to the product of the cone volume and the percentage of the total torque generated by the cutters on the bit which is attributable to the cutters mounted within the cone.

SUMMARY OF THE INVENTION

According to the invention, therefore, there is provided a method of predicting the walk rate of a design of rotary drag-type drill bit of the kind where the leading face of the bit body is formed with a central depression, or cone, which is generally coaxial with the axis of rotation of the bit, and a plurality of cutters mounted on the leading face of the bit both within and outside of said cone, the method comprising the steps of:

calculating the cone volume $V_{cone}$ (as hereinbefore defined) of the bit;

calculating that ratio $$\frac{T_{cone}}{T_{bit}}$$

of the total torque generated by the cutters on the bit which is attributable to those cutters which are mounted in said cone;

calculating a Walk Factor $$F = V_{cone} \times \frac{T_{cone}}{T_{bit}};$$

and determining the predicted walk rate W of the bit from a database relating previously established values of F for other drill bits to the respective walk rates W for those drill bits.

The database may conveniently be in the form of a graph of previously established values of walk factor plotted against walk rate. However, it will be appreciated that the data on previously established values does not necessarily have to be presented graphically as a graph from which values may be read off, but could equally well be presented as a table or as data in a computer from which values can be interpolated. References to a database are therefore intended to include other forms of representation of the data.

In some types of drill bit the graph may be linear in which case the walk rate is directly proportional to the walk factor F. In this case the only data necessary for determining the predicted walk rate from the walk factor are the constants a and b in the expression W=aF+b.

The cone volume $V_{cone}$ may be determined by physical measurement of an actual drill bit or, more usually, may be determined from a computer model of a bit design. Similarly, the ratio $$\frac{T_{cone}}{T_{bit}}$$

cone of the total torque generated by the cutters which is attributable to those cutters which are mounted in the cone may also be determined from a computer model of the bit design, for example using the analysis method described in our co-pending British Patent Application No. 9815125.1.

The corresponding values of walk rate W defining the graph used in the method of the invention may be obtained from available data concerning the field use in drilling operations of existing drill bits of the kind to which the invention relates.

The method according to the invention may also include the further step of modifying the design of drill bit in a manner to adjust the cone volume $V_{cone}$ of the bit and/or the ratio $$\frac{T_{cone}}{T_{bit}}$$

of total torque in a manner to give a desired walk rate W.

DETAILED DESCRIPTION OF THE PREFERRED EMBODIMENTS

Figures 1, 2:
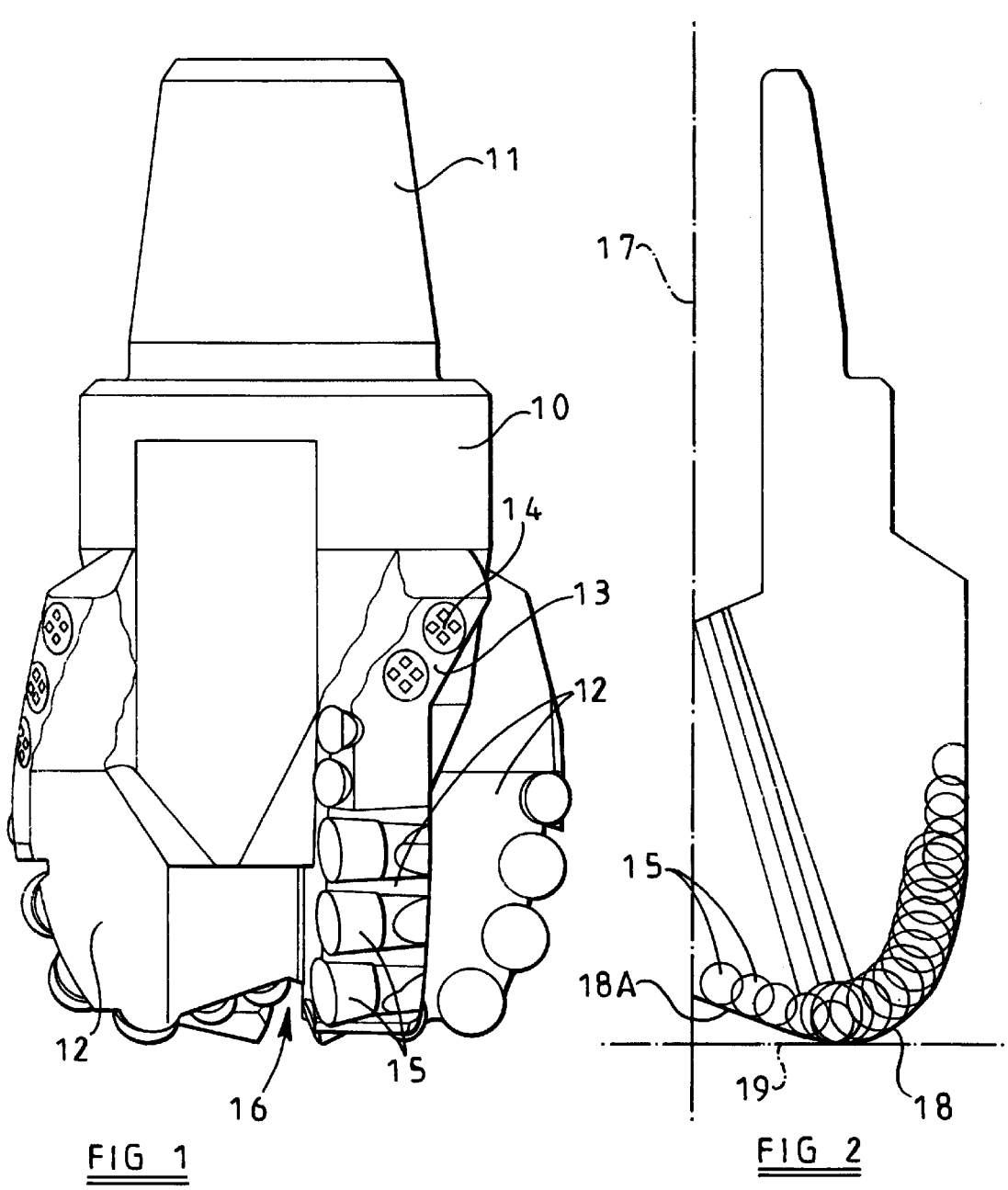
FIG. 1 is a diagrammatic side elevation of a drag-type drill bit of the kind to which the present invention is applicable.
FIG. 2 is a diagrammatic representation showing the cutting profile of the drill bit of FIG. 1.

FIG. 1 shows a typical drag-type rotary drill bit of the kind to which the present invention relates. The bit comprises a bit body 10 formed with a tapered pin 11 for connecting the bit to a drill collar for mounting on the end of a drill string.

The leading face of the bit body is defined by four blades 12 integrally formed on the bit body and extending generally radially outwards from the central axis of rotation of the bit. The outer extremities of the blades 12 lead into kickers 13 which engage the sides of the borehole being drilled and are provided with abrasion elements 14 received in sockets in the outer surface of the kickers. Cutters 15 are mounted in sockets in the blades 12, in known manner. Each cutter is a polycrystalline diamond compact comprising a facing table of polycrystalline diamond bonded to a substrate of tungsten carbide, each cutter being generally cylindrical.

The inner portion of the outer surface of each blade 12, as it extends away from the central axis of rotation 12 of the bit, is inclined in the axial direction away from the pin 11 so that the surfaces of the blades define a generally conical depression or "cone" 16 in the leading face defined by the blades 12.

FIG. 2 is a diagrammatic half section of the bit showing the cutting profile of the bit. Although the cutters 15 are at different circumferential locations around the axis 17 of the bit, FIG. 2 in conventional manner shows the position of the cutters as they pass through a single radial plane as the bit rotates, thus showing the cross-sectional shape of the cutting profile of the bit which is the profile of the bottom of the borehole which the bit drills. The volume of the space enclosed between the part of the profile lying within the cone and a flat plane 19 which is tangential to the mouth of the cone is referred to as the cone volume $V_{cone}$. Alternatively, the cone volume may conveniently be regarded as being the volume of the space enclosed between the plane 19 and the portion 18A within the cone of an imaginary surface 18 which is tangential to the tips of the cutters 15.

In accordance with the present invention the walk factor F of the drill bit is given by the following equation:

$$F = V_{cone} \times \frac{T_{cone}}{T_{bit}}$$

Where $V_{cone}$=the cone volume, and $$\frac{T_{cone}}{T_{bit}}$$

the ratio of the total torque generated by the cutters on the drill bit which is attributable to those cutters which are mounted within the cone 16.

The value $$\frac{T_{cone}}{T_{bit}}$$

may be determined using a computer model of the bit structure, for example as described in our co-pending British Patent Application No. 9815125.1.

Figure 3:
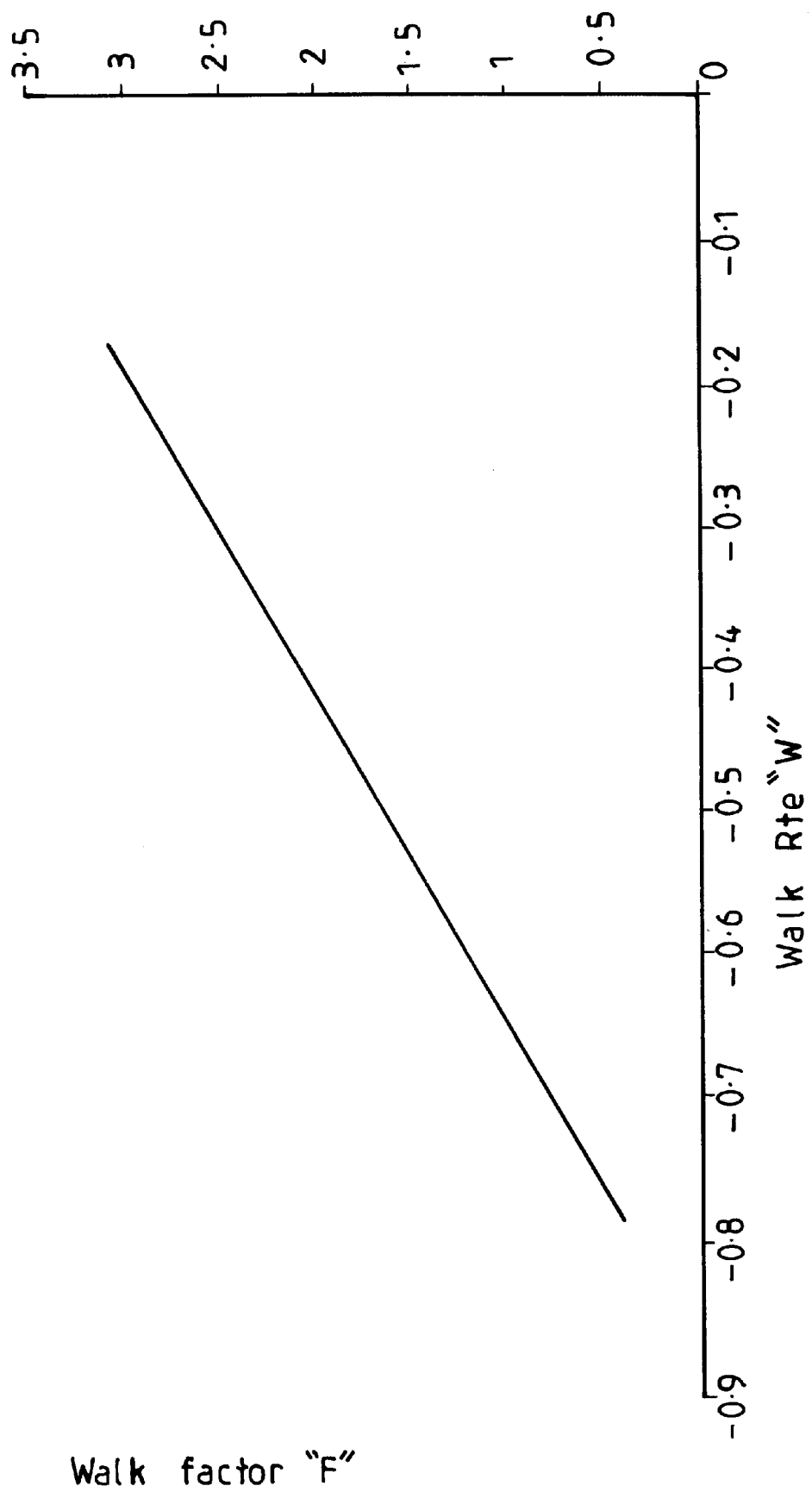
FIG. 3 is a graph showing a plot of walk rate against a walk factor determined in accordance with the present invention.

FIG. 3 is a graph of the walk factor F of a number of drill bits of which the walk rate is already known, plotted against that walk rate. In FIG. 3 the walk rates are all negative, indicating natural deviation of the drill bit to the left during drilling. It will be noted that the walk rate increases with decrease in the walk factor.

The walk rate of each drill bit contributing to the plot is determined from data acquired during an actual drilling run of each bit. Generally speaking the walk rate will be a mean value derived from a large number of values of walk rate obtained from a number of runs of the drill bit. As previously described, the corresponding walk factor F for each bit may be obtained from a computer model of the bit design, using well established techniques.

Once the graph shown in FIG. 3 has been obtained, it then becomes possible, in accordance with the invention, to predict the average walk rate of an actual or proposed design of drill bit by determining the walk factor for that design and reading off from the graph the corresponding predicted walk rate W.

As previously described, this information of predicted walk rate can be used in controlling the direction of drilling of the bit by combining this knowledge of the walk rate with the other parameters normally varied to control the direction of drilling.

Alternatively, the invention allows the effect on the walk rate of modifications to the design of the drill bit to be seen.

Whereas the present invention has been described in particular relation to the drawings attached hereto, it should be understood that other and further modifications, apart from those shown or suggested herein, may be made within the scope and spirit of the present invention.

What is claimed:

1. A method of predicting a walk rate of a design of a rotary drag-type drill bit with an axis of rotation and a bit body, where a leading face of the bit body is formed with a central depression generally comprising a cone, which is generally coaxial with the axis of rotation of the bit, and a plurality of cutters mounted on the leading face of the bit body both within and outside of said cone, the method comprising the steps of:

calculating a cone volume $V_{cone}$ of the bit;

calculating a ratio $$\frac{T_{cone}}{T_{bit}}$$

of a total torque generated by the cutters on the bit which is attributable to those cutters which are mounted in said cone;

calculating a Walk Factor $$F = V_{cone} \times \frac{T_{cone}}{T_{bit}};$$

and determining a predicted walk rate W of the bit design from a database relating previously established values of Walk Factors and walk rates.

2. A method according to claim 1, wherein the database is in the form of a graph of previously established values of walk factor plotted against walk rate.

3. A method according to claim 1, wherein the database is in the form of data stored in a computer from which values can be interpolated.

4. A method according to claim 1, wherein the walk rate is directly proportional to the walk factor F, and the data for determining the predicted walk rate W from the walk factor F comprise the constants a and b in the expression W=aF+b.

5. A method according to claim 1, wherein the cone volume $V_{cone}$ is determined by physical measurement of an actual drill bit.

6. A method according to claim 1, wherein the cone volume $V_{cone}$ is determined from a computer model of a bit design.

7. A method according to claim 1, wherein the ratio $$\frac{T_{cone}}{T_{bit}}$$

of the total torque generated by the cutters which is attributable to those cutters which are mounted in the cone is determined from a computer model of the bit design.

8. A method according to claim 1, including the further step of modifying the design of the bit in a manner to adjust at least one of the cone volume $V_{cone}$ of the bit and the ratio $$\frac{T_{cone}}{T_{bit}}$$

of total torque in a manner to give the predicted walk rate W a desired value.

* * * * *